United States Patent
Zhu et al.

(10) Patent No.: US 11,081,610 B2
(45) Date of Patent: Aug. 3, 2021

(54) ANODE UP—CATHODE DOWN SILICON AND GERMANIUM PHOTODIODE

(71) Applicant: Newport Fab, LLC, Newport Beach, CA (US)

(72) Inventors: Difeng Zhu, San Diego, CA (US); Edward Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/533,609

(22) Filed: Aug. 6, 2019

(65) Prior Publication Data
US 2020/0259037 A1   Aug. 13, 2020

Related U.S. Application Data

(63) Continuation-in-part of application No. 16/270,425, filed on Feb. 7, 2019, now Pat. No. 10,892,373.

(51) Int. Cl.
*H01L 31/105* (2006.01)
*H01L 31/18* (2006.01)
(Continued)

(52) U.S. Cl.
CPC ...... *H01L 31/1055* (2013.01); *H01L 27/1443* (2013.01); *H01L 31/0288* (2013.01); *H01L 31/1804* (2013.01)

(58) Field of Classification Search
CPC ......... H01L 2924/12043; H01L 31/028; H01L 31/1804; H01L 31/0288; H01L 31/1055;
(Continued)

(56) References Cited

U.S. PATENT DOCUMENTS

| 2017/0012143 A1 | 1/2017 | Usami |
| 2017/0317221 A1 | 11/2017 | Usami |

(Continued)

FOREIGN PATENT DOCUMENTS

| JP | 2010183032 A | * | 8/2010 |
| JP | 2017152434 A | * | 8/2017 |

OTHER PUBLICATIONS

DeRose, C.T., et al. "Ultra Compact 45 GHz CMOS Compatible Germanium Waveguide Photodiode with Low Dark Current." *Optics express*, 19(25), pp. 24897-24904, 2011.

(Continued)

*Primary Examiner* — Joseph C. Nicely
(74) *Attorney, Agent, or Firm* — Farjami & Farjami LLP

(57) ABSTRACT

There are disclosed various implementations of an anode over cathode germanium and silicon photodiode including an N type silicon region formed in a silicon substrate, the N type silicon region being a cathode of the photodiode. In addition, the photodiode includes a P type germanium region situated over the N type silicon region, the P type germanium region being an anode of the photodiode. An anode contact of the photodiode is situated over the P type germanium region providing the anode. In some implementations, silicided cathode contacts are formed over the N type silicon region providing the cathode. In some implementations, a P type silicon cap is formed over the P type germanium region. In those implementations, a silicided anode contact may be situated on the P type silicon cap.

20 Claims, 12 Drawing Sheets

(51) Int. Cl.
*H01L 27/144* (2006.01)
*H01L 31/0288* (2006.01)

(58) Field of Classification Search
CPC ........... H01L 31/03125; H01L 31/1808; H01L 31/1812; H01L 31/0203; H01L 29/6609; H01L 27/1443
See application file for complete search history.

(56) References Cited

U.S. PATENT DOCUMENTS

2020/0075792 A1* 3/2020 Zhu .................... H01L 31/1808
2020/0312990 A1* 10/2020 Roberts ................ B82Y 10/00

OTHER PUBLICATIONS

Masini, G., et al. "High-Performance p-i-n GE on SI Photodetectors for the Near infrared: From Model to Demonstration." *IEEE Transactions on Electron Devices*, 48 (6), pp. 1092-1096, Jun. 2001.
Virot, Léopold, et al., "Integrated Waveguide PIN Photodiodes Exploiting Lateral Si/Ge/Si Heterojunction," Opt. Express 25, pp. 19487-19496 (2017).
Vivien, Laurent, et al., "Zero-bias 40Gbit/s germanium waveguide photodetector on silicon," Opt. Express 20, pp. 1096-1101 (2012).

* cited by examiner

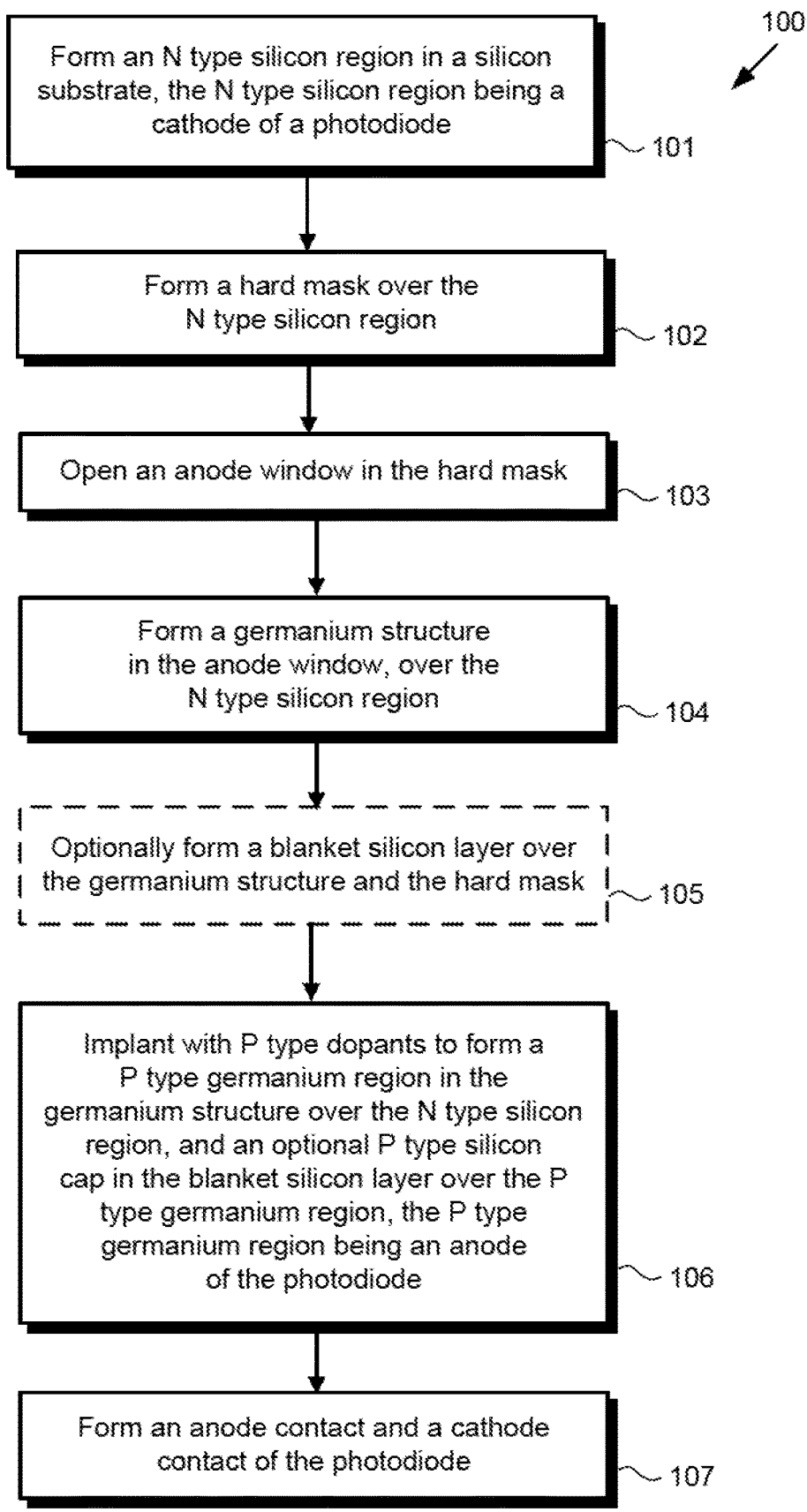

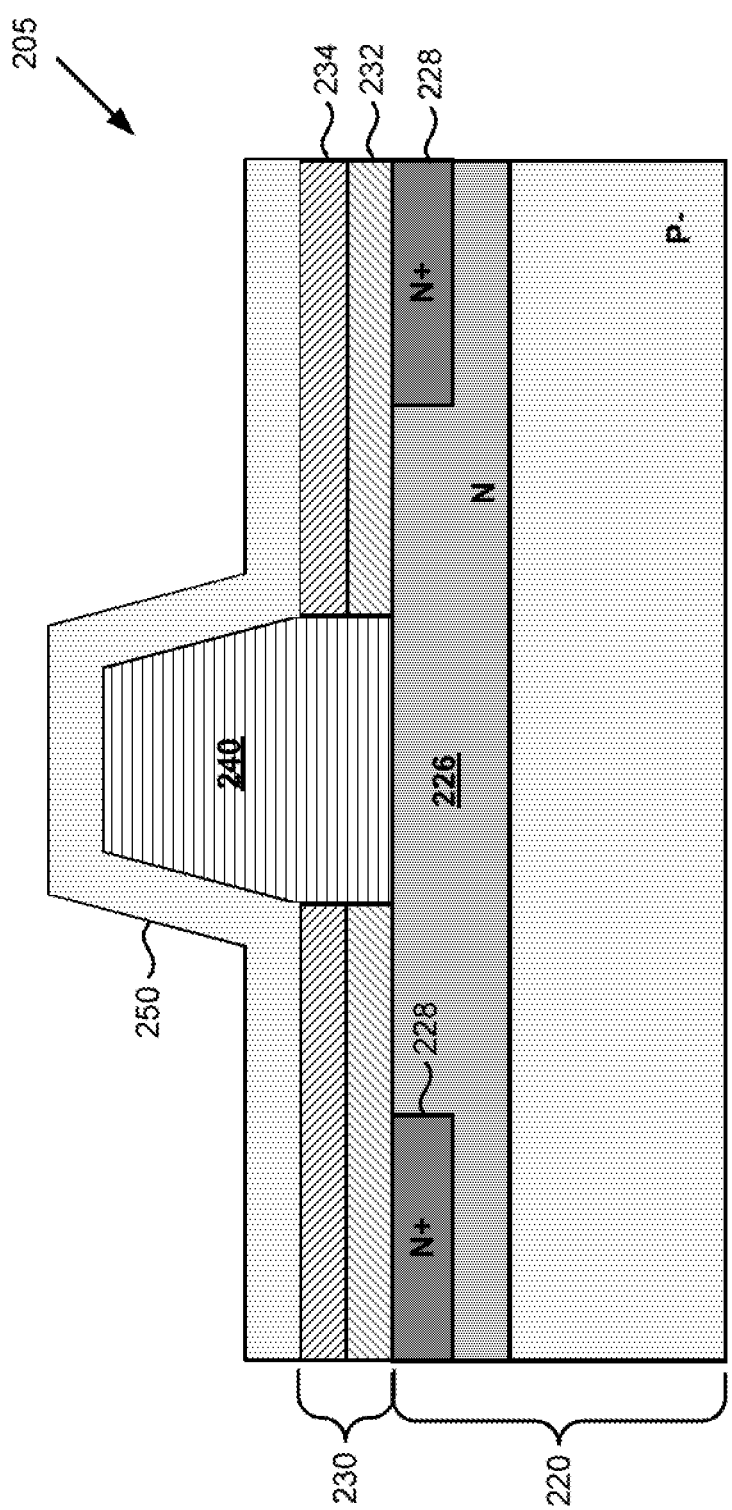

US 11,081,610 B2

ANODE UP—CATHODE DOWN SILICON AND GERMANIUM PHOTODIODE

CLAIMS OF PRIORITY

The present application is a continuation-in-part of and claims the benefit of and priority to application Ser. No. 16/270,425 filed on Feb. 7, 2019, titled "Germanium Photodiode with Silicon Cap." The disclosure and content of this application are hereby incorporated fully by reference into the present application.

BACKGROUND

Due to its ability to absorb light in the near infrared, as well as to its compatibility with silicon technology, germanium is desirable for use in the fabrication of high-speed photodiodes. In order to use germanium in photodiodes to absorb near infrared light and for high responsivity and high bandwidth, solutions for using germanium with silicon, and also reducing the photodiode contact resistance are needed.

In addition, germanium can be sensitive to chemicals typically present during silicon processing. For instance, hydrogen peroxide, which is widely used in many clean steps during silicon device fabrication, causes germanium that is exposed to it to dissolve. Consequently, there is a need in the art for new processing strategies enabling the production of high performance germanium based photodiodes having reduced contact resistance, while protecting the germanium used in photodiodes from damage during fabrication.

SUMMARY

The present disclosure is directed to an anode up-cathode down silicon and germanium photodiode as shown in and/or described in connection with at least one of the figures, and as set forth in the claims.

BRIEF DESCRIPTION OF THE DRAWINGS

FIG. 1 shows a flowchart presenting an exemplary method for fabricating an anode over cathode germanium and silicon photodiode, according to one implementation.

FIG. 2E shows a cross-sectional view of the exemplary structure of FIG. 2D at an optional subsequent fabrication stage according to the flowchart of FIG. 1.

DETAILED DESCRIPTION

Figure 2A:
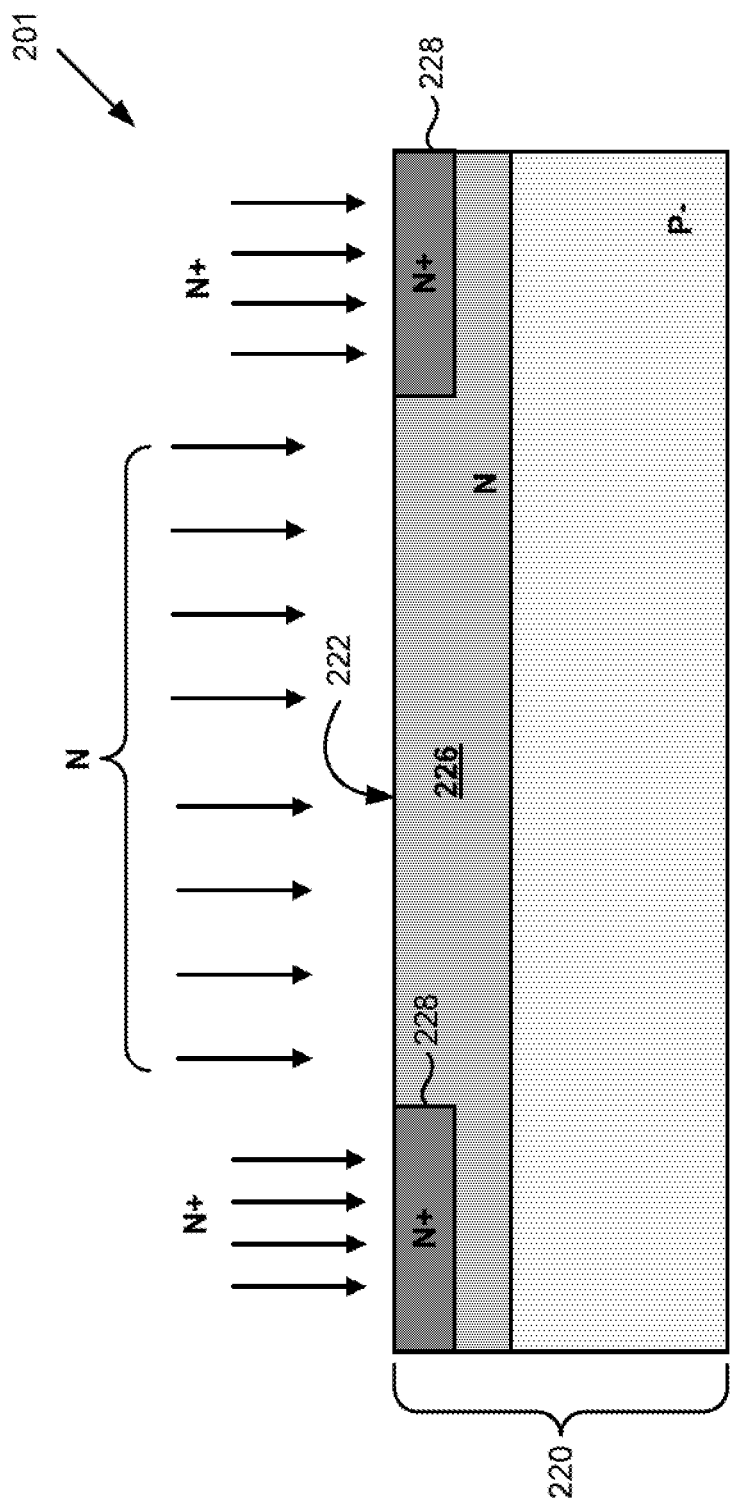
FIG. 2A shows a cross-sectional view of an exemplary structure corresponding to an initial fabrication stage according to the flowchart of FIG. 1.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, due to its ability to absorb light in the near infrared, as well as to its compatibility with silicon technology, germanium is desirable for use in the fabrication of high-speed photodiodes. However, in order to integrate germanium based photodiodes having high responsivity and high bandwidth with other circuit elements, either on-chip or off-chip, solutions, such as reducing contact resistance to circuit interconnects are needed. Moreover, and as also stated above, germanium can be sensitive to chemicals typically present during silicon processing. For instance, hydrogen peroxide, which is widely used in many clean steps during silicon device fabrication, can undesirably cause germanium to dissolve.

The present application is directed to anode over cathode germanium and silicon photodiodes and methods for their fabrication that address and overcome various problems in the art, such as the ones described above. Such a photodiode includes a P type germanium anode formed over an N type silicon cathode. Silicided cathode contacts formed on the N type cathode advantageously reduce N type contact resistance. In some implementations, the photodiode includes a silicon cap formed over and protecting the germanium structure, that is the anode of the photodiode, during fabrication and processing. In addition, when present, the silicon cap advantageously enables formation of a silicided anode contact over the P type anode, thereby further advantageously reducing P type contact resistance.

FIG. 1 shows flowchart 100 presenting an exemplary method for fabricating an anode over cathode germanium and silicon photodiode according to one implementation of the present application. It is noted that certain details and features have been left out of flowchart 100 that are apparent to a person of ordinary skill in the art, in order not to obscure the discussion of the inventive features in the present application.

Figure 2B:
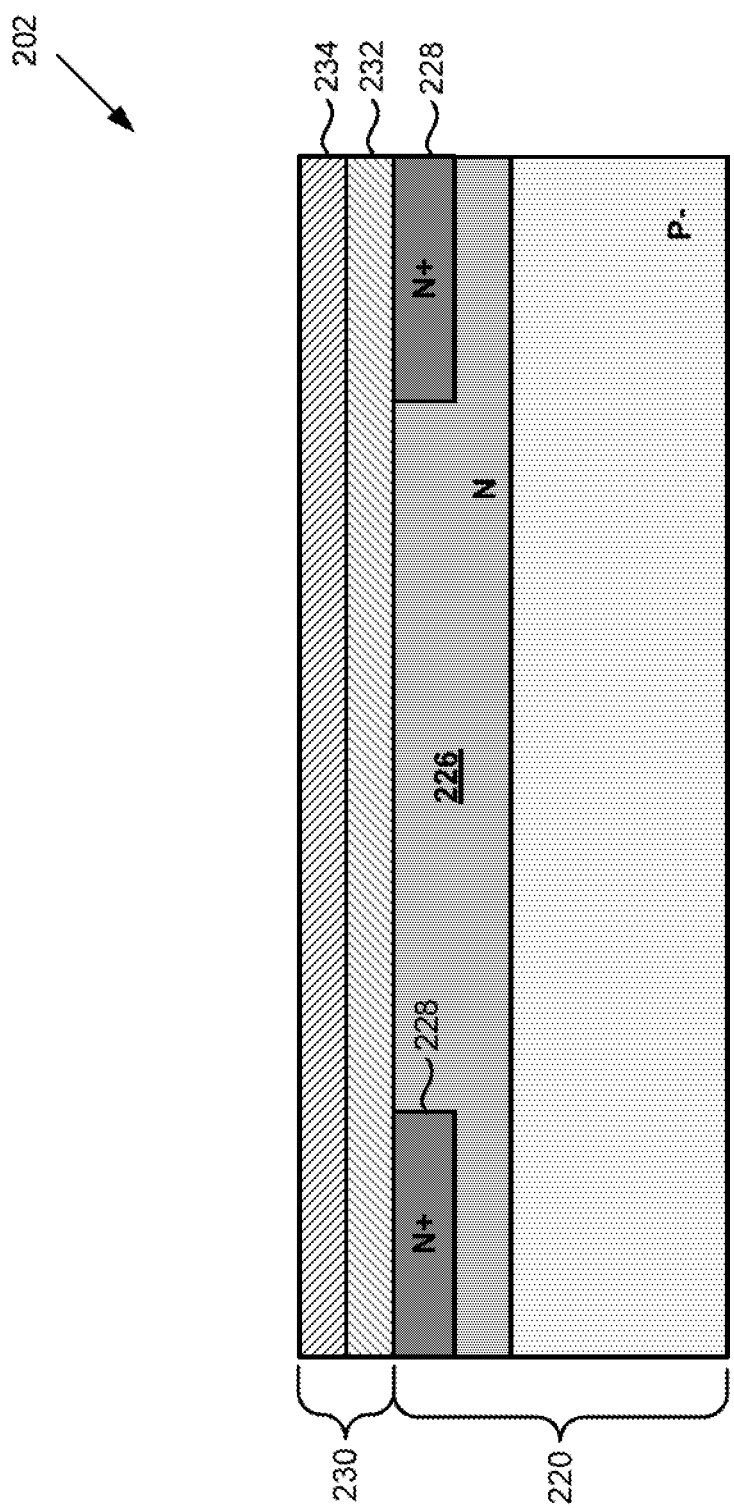
FIG. 2B shows a cross-sectional view of the exemplary structure of FIG. 2A at a subsequent fabrication stage according to the flowchart of FIG. 1.
Figure 2C:
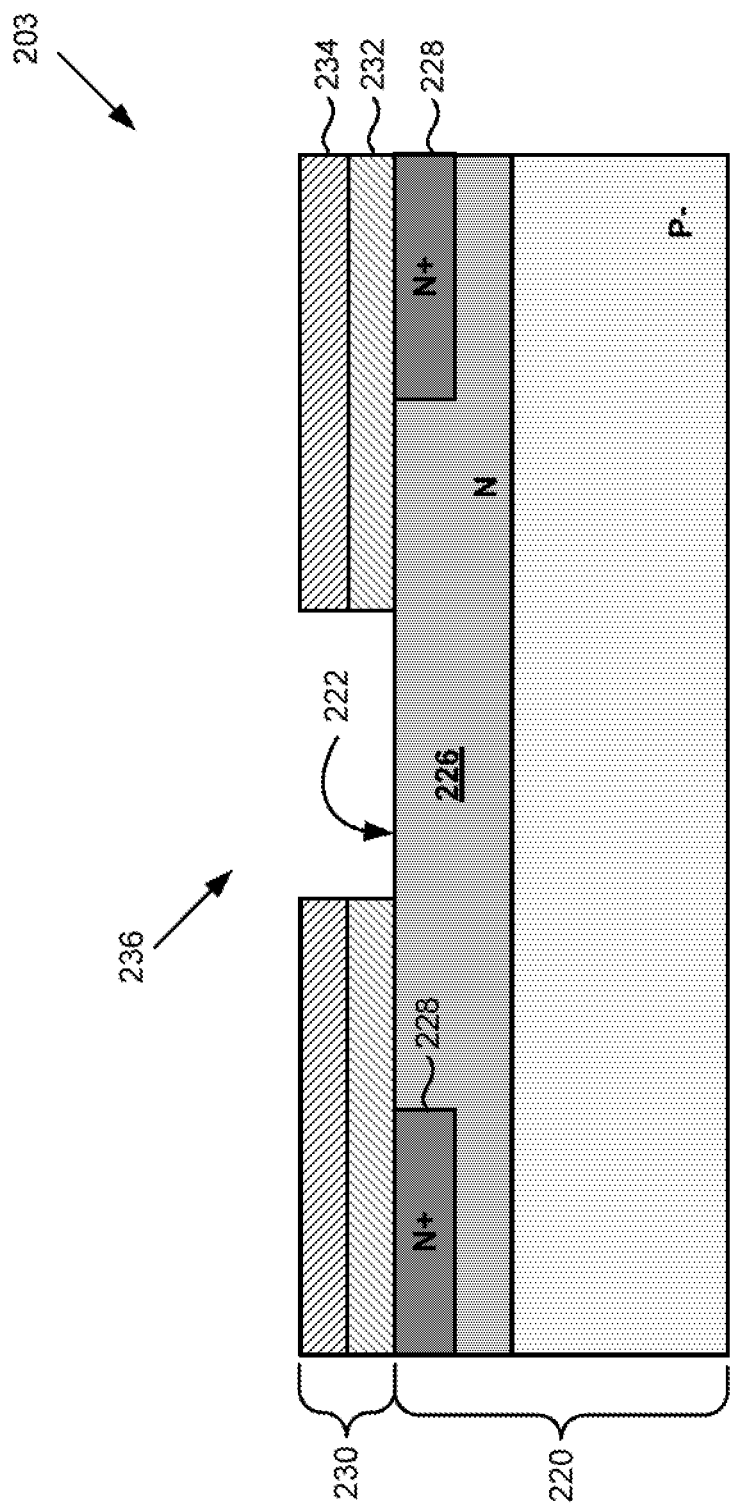
FIG. 2C shows a cross-sectional view of the exemplary structure of FIG. 2B at a subsequent fabrication stage according to the flowchart of FIG. 1.

With respect to FIGS. 2A, 2B, 2C, 2D, 2E, 2F, and 2G (hereinafter "FIGS. 2A-2G"), structures 201, 202, 203, 204, 205, 206, and 207 shown respectively in FIGS. 2A-2G illustrate the result of performing the method of flowchart 100, according to one implementation. For example, structure 201, in FIG. 2A, provides a cross-sectional view of silicon substrate 220 in which N type silicon region 226 providing a cathode of a photodiode and including N+ contact regions 228 is formed (action 101). Structure 202, in FIG. 2B, is a cross-sectional view of structure 201 after formation of hard mask 230 over N type silicon region 226 (action 102). Structure 203, in FIG. 2C, is a cross-sectional view of structure 202 after anode window 236 is formed in hard mask 230 (action 103), and so forth.

It is noted that the cross-sectional structures shown in FIGS. 2A-2G are provided as specific implementation of the present inventive principles, and are shown with such specificity for the purposes of conceptual clarity. Consequently, particular details such as the materials used to form the cross-sectional structures shown in FIGS. 2A-2G, as well as the techniques used to produce the various depicted features, are being provided merely as examples, and should not be interpreted as limitations.

Referring to flowchart 100, in FIG. 1, in combination with FIG. 2A, flowchart 100 begins with forming N type silicon region 226 in silicon substrate 220, N type silicon region 226 being a cathode of a photodiode (action 101). As shown in FIG. 2A, silicon substrate 220, which may be formed of P type bulk silicon, such as P-type bulk silicon, has N type silicon region 226 extending from top surface 222 of silicon substrate 220 into an upper portion of silicon substrate 220. Thus, silicon substrate 220 may be a bulk silicon layer of a bulk silicon device.

As shown in the cross-sectional view of FIG. 2A, in some implementations, N type silicon region 226 may be formed by ion implantation through top surface 222 of silicon substrate 220 and thermal diffusion of the N type dopants. For example, phosphorous (P) may be implanted into silicon substrate 220 to a dopant concentration of approximately ⃞ $0^{11}$ cm$^{11}$. As further shown in FIG. 2A, N type silicon region 226 includes N+ contact regions 228 situated therein. N+ type contact regions 228 may also be formed through ion implantation and diffusion of N type dopants to form N+ contact regions 228. For example, arsenic (As) may be implanted into N type silicon region 226 to form N+ contact regions 228 having a dopant concentration of approximately $10^{11}$ cm$^{11}$.

Moving to structure 202 in FIG. 2B, with continued reference to flowchart 100, in FIG. 1, flowchart 100 continues with forming hard mask 230 over N type silicon region 226 (action 102). In some implementations, as shown in FIG. 2B, hard mask 230 may be formed as a multi-layer hard mask including lower dielectric layer 232 formed over N type silicon region 226 and upper dielectric layer 234 formed over lower dielectric layer 232. Lower dielectric layer 232 and upper dielectric layer 234 may be formed using any material and any technique typically employed in the art. For example, lower dielectric layer 232 may be formed of silicon dioxide ($SiO_2$), which may be deposited or thermally grown to produce lower dielectric layer 232. As another example, upper dielectric layer 234 may be formed of silicon nitride ($Si_3N_4$), and, like lower dielectric layer 232, may be deposited or thermally grown.

Continuing to structure 203 in FIG. 2C, with further reference to flowchart 100, in FIG. 1, flowchart 100 continues with opening anode window 236 in hard mask 230 over N type silicon region 226 (action 103). As shown in FIG. 2C, anode window 236 exposes N type silicon region 226 at top surface 222 of silicon substrate 220.

Anode window 236 may be opened in hard mask 230 using any suitable techniques known in the art. For example, in some implementations, plasma etching may be performed to open anode window 236 through upper dielectric layer 234 and lower dielectric layer 232. In implementations in which upper dielectric layer 234 is formed of $Si_3N_4$ and lower dielectric layer is formed of $SiO_2$, plasma etching of anode window 236 may be performed using one of tetrafluoromethane ($CF_4$), sulfur hexafluoride ($SF_6$), or nitrogen trifluoride ($NF_3$), for example.

Figure 2D:
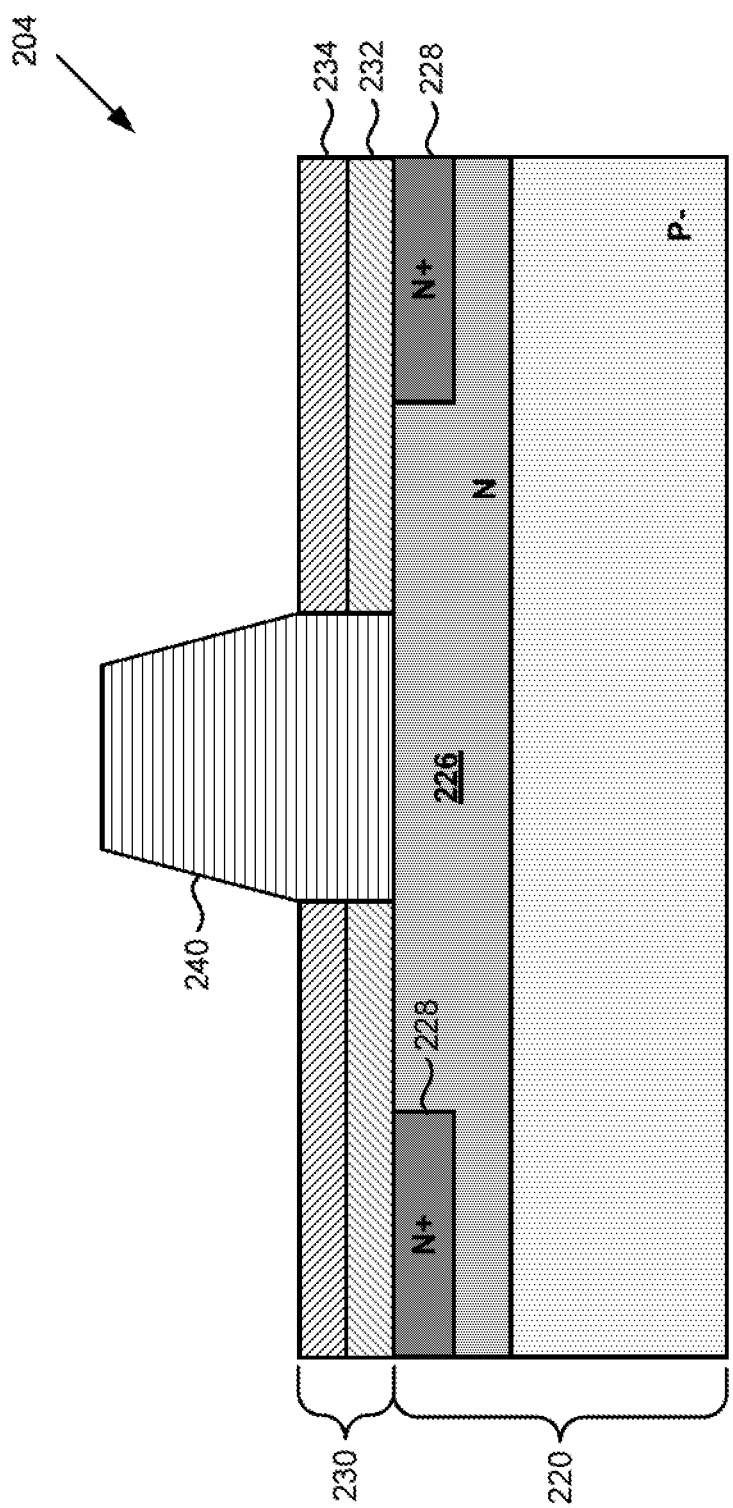
FIG. 2D shows a cross-sectional view of the exemplary structure of FIG. 2C at a subsequent fabrication stage according to the flowchart of FIG. 1.

Moving to structure 204 in FIG. 2D, with continued reference to flowchart 100, in FIG. 1, flowchart 100 continues with forming germanium structure 240 in anode window 236, over N type silicon region 226 (action 104). Germanium structure 240 may be selectively formed on N type silicon region 226 within the confines of anode window 236, for example, and may be initially substantially intrinsic (i.e. substantially undoped), or may have a low P type dopant concentration, such as a P type dopant concentration of from approximately $10^{11}$ cm$^{11}$ to approximately ⃞ $0^{11}$ cm$^{11}$. In some implementations, germanium structure 240 may be formed in anode window 236 to a thickness of several hundred nanometers, such as to a thickness of approximately four hundred nanometers (400 nm), for example, over N type silicon region 226. However, in other implementations, germanium structure 240 may be formed to a thickness of several micrometers over N type silicon region 726.

The selective formation of germanium structure 240 in anode window 236 may be performed using any suitable techniques known in the art. For example, germanium structure 240 may be deposited or epitaxially grown using one of chemical vapor deposition (CVD) or molecular beam epitaxy (MBE). Alternatively, in some implementations, it may be advantageous or desirable to selectively form germanium structure 240 using one of atomic layer deposition (ALD) or low energy plasma-enhanced chemical vapor deposition (LEPECVD).

Referring to structure 205, in FIG. 2E, in one implementation, flowchart 100 may continue with optionally forming blanket silicon layer 250 over germanium structure 240 and hard mask 230 (action 105). In contrast to the selective formation of germanium structure 240 in anode window 236, blanket silicon layer 250 may be formed non-selectively as a conformal blanket layer over germanium structure 240 and hard mask 230. However, it is noted that, when optionally formed, blanket silicon layer 250 is formed in situ with respect to formation of germanium structure 240 in action 104. That is to say, formation of germanium structure 240 and formation of blanket silicon layer 250 may occur as a substantially continuous growth process in the same growth chamber.

In some implementations, blanket silicon layer 250 may be formed over germanium structure 240 and hard mask 230 to a thickness of approximately seventy nanometers (70 nm), for example. Blanket silicon layer 250 may be formed using any suitable techniques known in the art. For example, blanket silicon layer 250 may be formed using any one of CVD, MBE, ALD, or LEPECVD.

It is noted that formation of optional blanket silicon layer 250 results in germanium structure 240 being encapsulated. That is to say, in those implementations, germanium structure 240 is adjoined along the entirety of its bottom surface by N type silicon region 226 of silicon substrate 220, along the entirety of its side surfaces by the combination of hard mask 230 and blanket silicon layer 250, and along the entirety of its top surface by blanket silicon layer 250.

The encapsulation of germanium structure 240 resulting from the optional formation of blanket silicon layer 250 protects germanium structure 240 from thermal and chemical damage during subsequent fabrication steps. For example, and despite the relatively low melting point of germanium, germanium structure 240 may be annealed at a temperature of approximately eight hundred and fifty degrees centigrade (850 DC). Advantageously, annealing of germanium structure 240 can substantially reduce dark current in a photodiode including germanium structure 240. For example, annealing of structure 205 at a temperature of approximately 850° C. can reduce dark current in a photodiode including germanium structure 240 by almost two orders of magnitude, i.e., by almost one hundred times, when compared to a photodiode in which a corresponding germanium structure is not annealed. In addition, encapsulation of germanium structure 240 prevents exposure of germanium structure 240 to harmful chemicals typically used during semiconductor device fabrication.

Figure 2F:
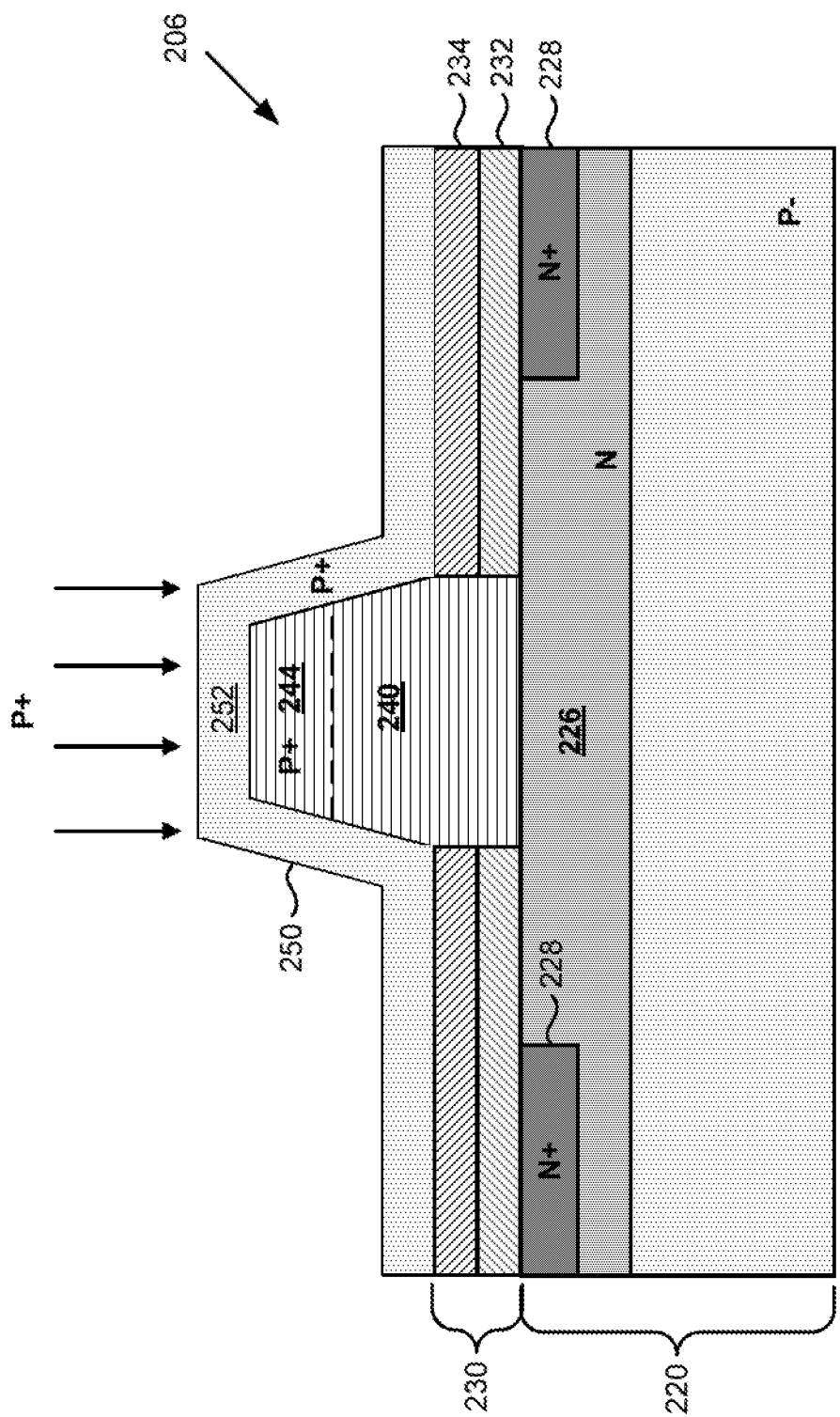
FIG. 2F shows a cross-sectional view of the exemplary structure of FIG. 2E at a subsequent fabrication stage according to the flowchart of FIG. 1.

Referring to structure 206, in FIG. 2F, flowchart 100 continues with implanting with P type dopants to form P type germanium region 244 in germanium structure 240 and optional P type silicon cap 252 over P type germanium region 244, where P type germanium region 244 is the anode of the photodiode being fabricated (action 106). According to the exemplary implementation shown in FIG. 2F, P type germanium region 244 and optional P type silicon cap 252 are highly doped to a P+ dopant concentration. For example, in one implementation, P type silicon region 244 and optional P type silicon cap 252 may be doped with boron (B) to a dopant concentration of from approximately $10^{11}$ cm$^{11}$ to approximately $20^{11}$ cm$^{11}$.

Figure 2G:
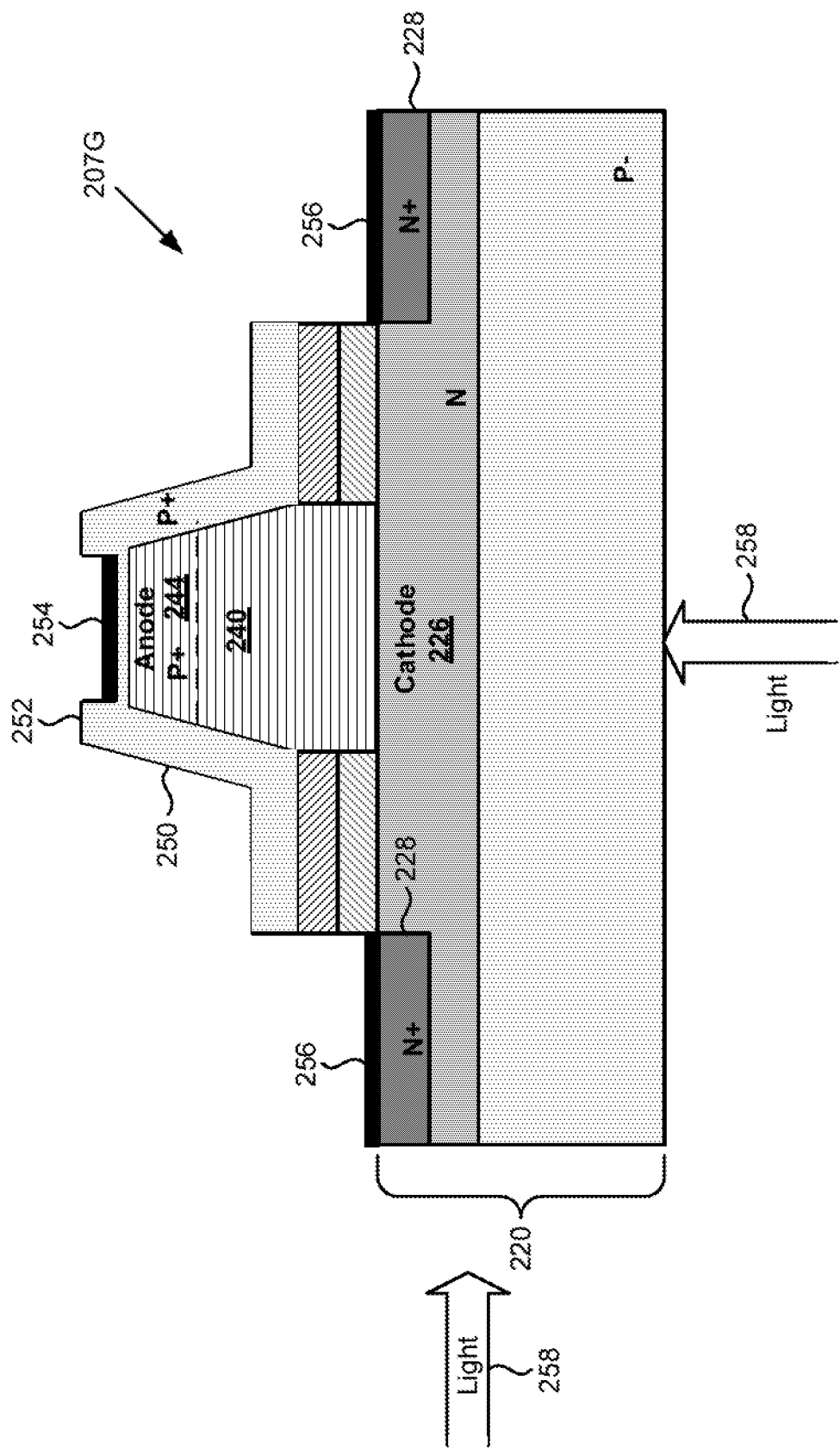
FIG. 2G shows a cross-sectional view of an exemplary anode over cathode germanium and silicon photodiode, according to one implementation.

It is noted that the dopant implantation process used in action 106 may be performed using a high concentration of P type dopants but relatively low energy, and be limited to implanting germanium structure 240 and optional P type silicon cap 252 over germanium structure 240, and exclude all neighboring semiconductor structures. As a result, implantation by P type dopants in action 106 will typically not affect the N type dopant profiles of N type silicon region 226 or N+ contact regions 228. It is further noted that in implementations in which optional blanket silicon layer 250 is omitted, implantation of P type dopants in action 106 may be directly into germanium structure 740, rather than through an intermediary layer such as optional blanket silicon layer 250. Nevertheless, due to the relatively low implantation energy used in action 106, the portion of germanium structure 240 situated above N type silicon region 226 and below P type germanium region 244 may be a substantially intrinsic (i.e. substantially undoped) germanium region, or may be a P− type region as described above. Flowchart 100 can conclude with forming an anode contact and one or more cathode contacts of the photodiode (action 107). FIG. 2G shows anode over cathode photodiode 207G including anode contact 254 and cathode contacts 256, according to one implementation. As shown in FIG. 2G, anode contact 254 is situated on P type silicon cap 252, and cathode contacts 256 are situated on N+ contact regions 228 of N type silicon region 226 serving as the cathode of photodiode 207G. Anode contact 254 and cathode contacts 256 may be metal or metal alloy contacts, such as cobalt/nickel alloy contacts, for example. It is noted that cathode contacts 256 may be electrically shorted to one another using metallization layer(s) during back end of line (BEOL) processing, as known in the art.

The transformation of structure 206, in FIG. 2F, to photodiode 207G in FIG. 2G may include several intermediate processing steps. For example, optional blanket silicon layer 250, and hard mask 230 may be selectively etched away to expose N+ contact regions 228 of N type silicon region 226 that are covered by cathode contacts 256 in FIG. 2G, as well as to define P type silicon cap 252. Subsequently, a silicide blocking layer (not shown in the present figures) may be selectively formed over P type silicon cap 252.

A window may be etched in the silicide blocking layer to reveal the p art on of P type silicon cap 252 covered by anode contact 254 in FIG. 2G, and that portion of P type silicon cap 252 may be partially etched away. Then, a self-aligned silicidation process may be performed on the exposed portion of P type silicon cap 252, and on the exposed portions of N+ contact regions 228 prior to formation of anode contact 254 and cathode contacts 256. Thus, anode contact 254 and cathode contacts 256 may be silicided contacts, thereby improving the ohmic contact of anode contact 254 with P type silicon cap 252 and P type germanium region 244, and improving the ohmic contact of cathode contacts 256 with N+ contact regions 228 of N type silicon region 226 serving as the cathode of photodiode 207G. As shown in FIG. 2G, photodiode 207G is configured to detect light 258 entering silicon substrate 220 from the side or from below N type silicon region 226 and P type germanium region 244. In sonic implementations, photodiode 207G may be configured to detect light 258 entering silicon substrate 220 in a direction parallel to top surface 222 of silicon substrate 220 and/or perpendicular to top surface 222. However, in other implementations, photodiode 207G may be configured to detect light 258 entering silicon substrate 220 in a direction approximately parallel to top surface 222 of silicon substrate 220 and/or approximately perpendicular to top surface 222.

Figure 2H:
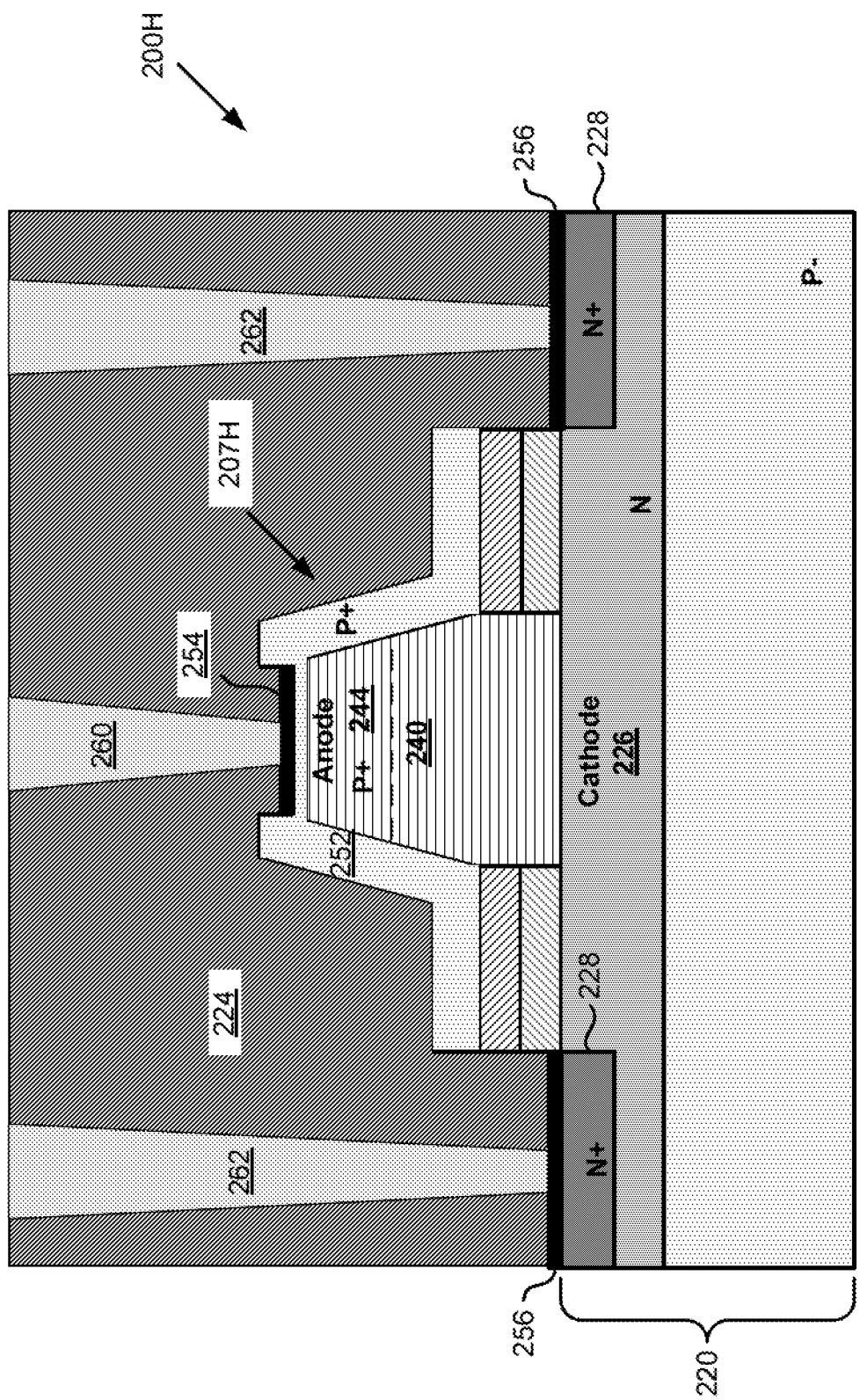
FIG. 2H shows a cross-sectional view of the exemplary photodiode of FIG. 2G coupled to metal contacts enabling integration of the photodiode with other active and/or passive circuit elements, according to one implementation.

FIG. 2H shows a cross-sectional view of structure 200H including exemplary photodiode 207H coupled to metal contacts enabling integration of photodiode 207H with other active and/or passive circuit elements, according to one implementation. In addition to the features shown in FIGS. 2A-2G and described by reference to flowchart 100, in FIG. 1, structure 200H includes interlayer dielectric 224 formed over photodiode 207H, metal contact 260 extending through interlayer dielectric 224 to connect to anode contact 254, and metal contacts 262 extending through interlayer dielectric 224 to connect to cathode contacts 256.

Metal contacts 260 and 262 may be formed of Tungsten (W) for example, and may connect anode contact 254 and cathode contacts 256 to one or more metallization layers of an integrated circuit chip or die including photodiode 207H. Interlayer dielectric 224 may be formed using any material and any technique typically employed in the art. For example, interlayer dielectric 224 may be formed of $SiO_2$, which may be deposited or thermally grown. As another example, interlayer dielectric 224 may include one or more $Si_3N_4$, layers, which may also be deposited or thermally grown. As yet another example, interlayer dielectric 224 may be formed of a dielectric material having a lower dielectric constant than $SiO_2$, such silicon oxycarbide (SiOC), for example.

Figure 2I:
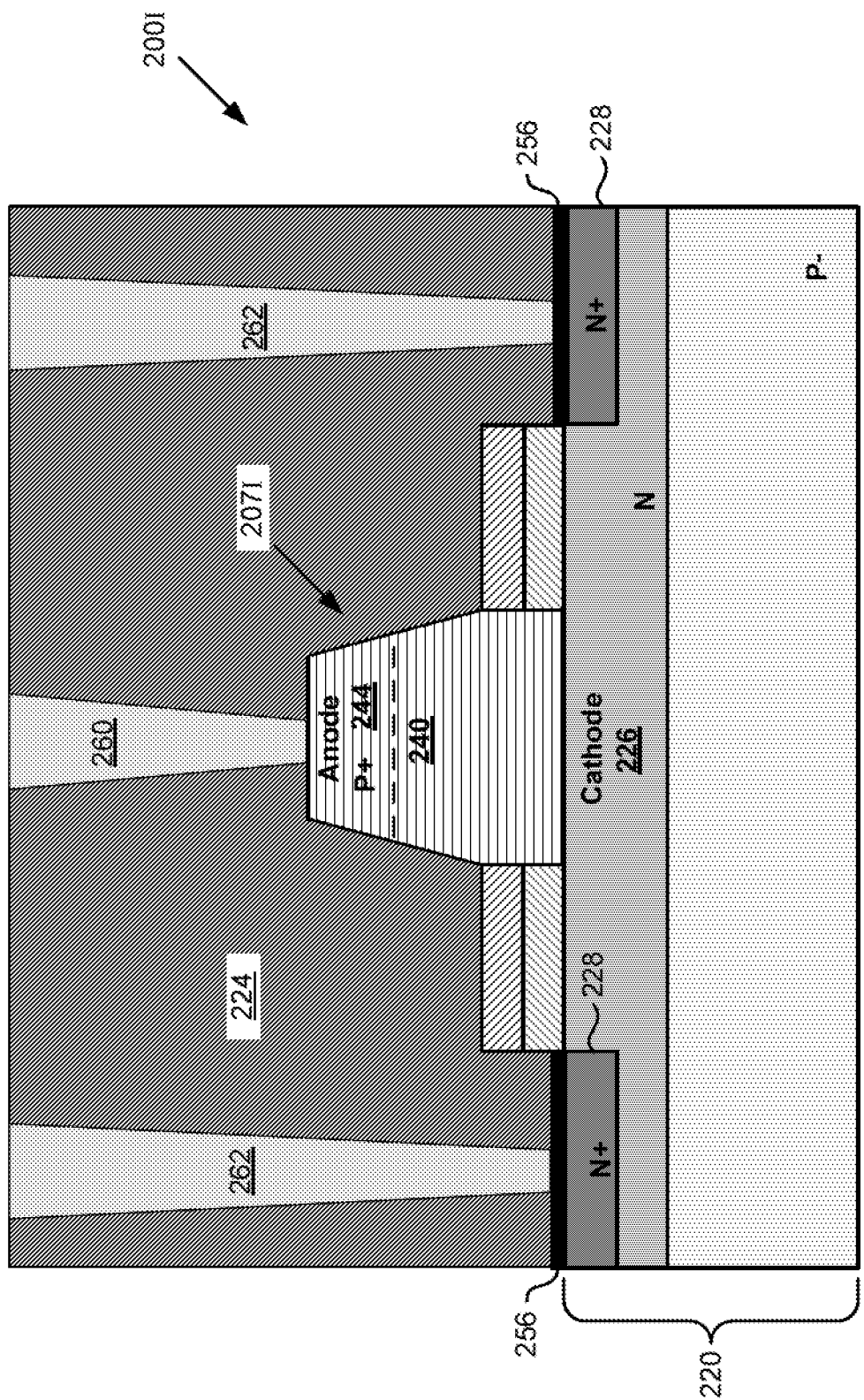
FIG. 2I shows a cross-sectional view of an exemplary anode over cathode germanium and silicon photodiode coupled to metal contacts enabling integration of the photodiode with other active and/or passive circuit elements, according to another implementation.

FIG. 2I shows a cross-sectional view of structure 200I including exemplary anode over cathode germanium and silicon photodiode 207I coupled to metal contacts enabling integration of photodiode 207I with other active and/or passive circuit elements, according to another implementation. It is noted that any features identified in FIG. 2I by reference numbers identical to those appearing in FIGS. 2A-2G and 2H correspond respectively to those features and may share any of their characteristics described above.

Photodiode 207I, in FIG. 2I, differs from photodiode 207G and 207H, in FIGS. 2G and 2H, in that action 105 is omitted during fabrication of photodiode 207I. That is to say, optional blanket silicon layer 250 is not formed over germanium structure 240 and hard mask 230 prior to P type dopant implantation in action 106, resulting in the omission of P type silicon cap 252 over P type germanium region 244, as well as omission of silicided anode contact 254 situated on P type silicon cap 252. Consequently, metal contact 260 situated on P type germanium region 244, which may be formed as a tungsten metal contact, for example, serves as the anode contact of photodiode 207I. Thus, although like photodiode 207H, photodiode 207I may include silicided cathode contacts 256, the anode contact provided by metal contact 260 may not be a silicided contact.

Anode over cathode germanium and silicon photodiodes 207H and 207I disclosed above advantageously achieve significantly reduced contact resistance when compared to conventional photodiodes, such as one order of magnitude or approximately ten times reduction in contact resistance when compared to conventional cathode over anode photodiode structures. Moreover, anode over cathode germanium and silicon photodiodes 207H and 207I have reduced contact resistance while concurrently having superior responsivity, i.e., radiant sensitivity, high bandwidth, and low dark current density. By way of example, anode over cathode germanium and silicon photodiodes 207H and 207I may advantageously provide a low interconnect sheet resistance of approximately ten ohms per square ($\sim 10^{Ohm}{}_{sq}$), a responsivity of almost one ampere per watt ($\sim 0.9^{A1}{}_{W}$), a 3 dB bandwidth of approximately seventy gigahertz ($\sim 70$ Hz), and a dark current density of approximately ninety milliamperes per square centimeter at one volt ($\sim 90$ $^{mA1}{}_{cm^1}$ at ).

Figure 3A:
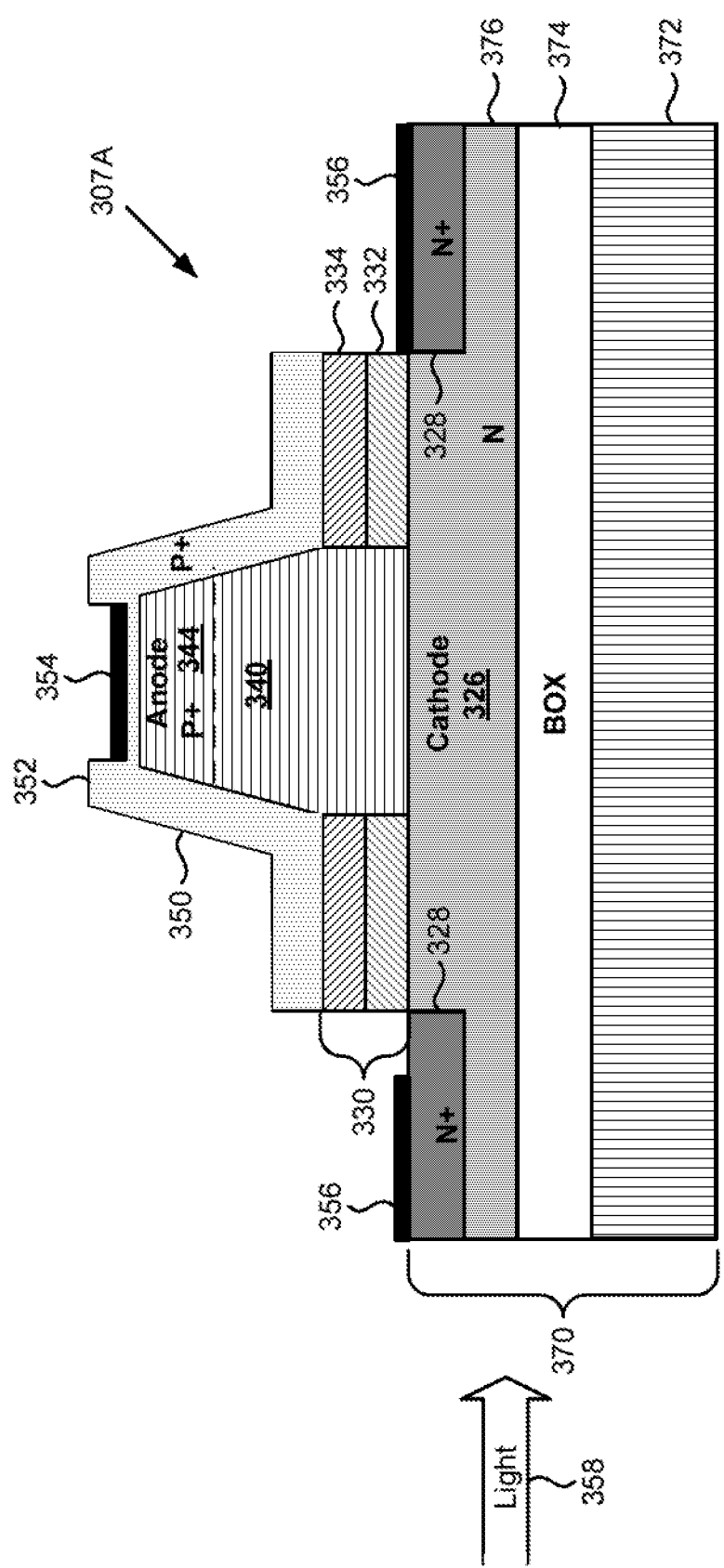
FIG. 3A shows a cross-sectional view of an exemplary anode over cathode germanium and silicon photodiode, according to another implementation.

FIG. 3A shows a cross-sectional view of an exemplary anode over cathode germanium and silicon photodiode according to another implementation. As shown in FIG. 3A, photodiode 307A includes silicon-on-insulator (SOI) body 370 having handle layer 372, which may be a bulk silicon layer, for example, silicon substrate 376, and buried insulator layer 374 shown as an exemplary buried-oxide (BOX) layer situated between handle layer 372 and silicon substrate 376. Thus, silicon substrate 376 may be a top silicon layer of a SOI device fabricated in SOI body 370. Moreover, according to the implementation shown in FIG. 3A, silicon substrate 376 includes N type silicon region 326 serving as the cathode of photodiode 307A.

In some implementations, N type silicon region 326 may be formed by ion implantation and thermal diffusion of N type dopants. For example, phosphorous (P) may be implanted into silicon substrate 376 to a dopant concentration of approximately $10^{11}$ cm$^{11}$ to form N type silicon region 326. As further shown in FIG. 3A, N type silicon region 326 includes N+ contact regions 328 situated therein. N+ contact regions may also be formed through ion implantation and diffusion of N type dopants to form N+ contact regions 328. For example, arsenic (As) may be implanted into N type silicon region 326 to form N+ contact regions 228 having a dopant concentration of approximately $0^{11}$ cm$^{11}$.

In some implementations, SOI body 370 may be formed by wafer bonding buried insulator layer 374 between handle layer 372 and silicon substrate 376. In some implementations, buried insulator layer 374 may be implemented as a BOX layer, such as a buried SiO$_2$ layer, as shown in FIG. 3A. In some of those implementations, SOI body 370 may be formed using a separation by implantation of oxygen (SIMOX) process, for example. In other implementations, buried insulator layer 374 may take the form of any other suitable dielectric, such as sapphire, for example. Thus, in some implementations, SOI body 370 may take the form of a silicon-on-sapphire (SOS) body.

In addition to SOI body 370 providing silicon substrate 376, photodiode 307A includes hard mask 330 disposed over N type silicon region 326. In some implementations, hard mask 330 may be formed as a multi-layer hard mask including lower dielectric layer 332 formed over N type silicon region 326 and upper dielectric layer 334 formed over lower dielectric layer 332. Photodiode 307A further includes germanium structure 340, including P type germanium region 344 formed over N type silicon region 326 and serving as the anode of photodiode 307A. Also shown. FIG. 3A are silicon layer 350 providing P type silicon cap 352 over germanium structure 340, anode contact 354 situated on P type silicon cap 352, and cathode contacts 356 situated on N+ contact regions 328 of N type silicon region 326.

Lower dielectric layer 332 and upper dielectric layer 334 may be formed using any material and any technique typically employed in the art. For example, lower dielectric layer 332 may be formed of SiO$_2$, which may be deposited or thermally grown to produce lower dielectric layer 332. As another example, upper dielectric layer 334 may be formed of Si$_3$N$_4$, and, like lower dielectric layer 332, may be deposited or thermally grown.

Germanium structure 340 may be selectively formed on N type silicon region 326 within the confines of an anode window opened in hard mask 330, as discussed above by reference to action 104 of flowchart 100, in FIG. 1. In some implementations, germanium structure 340 may be formed to a thickness of several hundred nanometers, such as to a thickness of approximately four hundred nanometers (400 nm), for example, over N type silicon region 326. However, in other implementations, germanium structure 340 may be formed to a thickness of several micrometers over N type silicon region 326. The selective formation of germanium structure 340 may be performed using any suitable techniques known in the art. For example, germanium structure 340 may be deposited or epitaxially grown using one of CVD or MBE. Alternatively, in some implementations, it may be advantageous or desirable to selectively form germanium structure 340 using one of ALD or LEPECVD.

As shown in FIG. 3A, P type silicon cap 352 is provided by conformal silicon layer 350 situated over germanium structure 340 and hard mask 330. It is noted that silicon layer 350 may be formed in situ with respect to formation of germanium structure 340. That is to say, formation of germanium structure 340 and formation of silicon layer 350 may occur as a substantially continuous growth process in the same growth chamber. In some implementations, silicon layer 350 may be formed over germanium structure 40 and hard mask 330 to a thickness of approximately seventy nanometers (70 nm), for example. Silicon layer 350 may be formed using any suitable techniques known in the art. For example, silicon layer 350 may be formed using any one of CVD, MBE, ALD, or LEPECVD.

It is noted that the presence of silicon layer 350 providing P type silicon cap 352 over germanium structure 340 results in germanium structure 340 being encapsulated. That is to say, germanium structure 340 is adjoined along the entirety of its bottom surface by N type silicon region 326 of silicon substrate 376, along the entirety of its side surfaces by the combination of hard mask 330 and P type silicon layer 350, and along the entirety of its top surface by P type silicon cap 352.

The encapsulation of germanium structure 340 protects germanium structure 340 from thermal and chemical damage during fabrication and processing. Consequently, and despite the relatively low melting point of germanium, germanium structure 340 may be annealed at a temperature of approximately 850° C. Advantageously, annealing of germanium structure 340 substantially reduces dark current in photodiode 307A. For example, the annealing of germanium structure 340 at a temperature of approximately 850° C. can reduce dark current in photodiode 307A by almost two orders of magnitude, i.e., by almost one hundred times, when compared to a photodiode in which a corresponding germanium structure is not annealed. In addition, encapsulation of germanium structure 340 prevents exposure of germanium structure 340 to harmful chemicals typically used during semiconductor device fabrication.

According to the exemplary implementation shown in FIG. 3A. P type germanium region 344 and P type silicon cap 352 are highly doped to a P+ dopant concentration. For example, in one implementation, P type germanium region 344 and P type silicon cap 352 may be doped with boron (B) to a dopant concentration of from approximately $10^{11}$ cm$^{11}$ to approximately $10^{11}$ cm$^{11}$.

It is noted that the dopant implantation process used to form P type germanium region 344 and P type silicon cap 352 may be performed using a high concentration of P type dopants but relatively low energy. As a result, implantation by P type dopants to form P type germanium region 344 and P type silicon cap 352 will typically not affect the N type dopant profiles of N type silicon region 326 or N+ contact regions 328. Moreover, due to the relatively low implantation energy used to form P type germanium region 344 and P type silicon cap 352, the portion of germanium structure 340 situated above N type silicon region 326 and below P type germanium region 344 may be a substantially intrinsic (i.e. substantially undoped) germanium region, or may have a low P type dopant concentration, such as a P type dopant concentration of from approximately $10^{11}$ cm$^{11}$ to approximately $10^{11}$ cm$^{11}$.

Anode contact 354 and cathode contacts 356 may be metal or metal alloy contacts, such as cobalt/nickel alloy contacts, for example. It is noted that cathode contacts 356 may be electrically shorted to one another using metallization layer(s) during BEOL processing, as known in the art. Anode contact 354 and cathode contacts 356 may be silicided contacts, thereby improving the ohmic contact of anode contact 354 with P type silicon cap 352 and P type germanium region 344, and improving the ohmic contact of cathode contacts 356 with N+ contact regions 328 and N type silicon region 326 serving as the cathode of photodiode 307A.

As shown FIG. 3A, photodiode 307A is configured to detect light 358 entering silicon substrate 376 from the side. That is to say photodiode 307A is configured to detect light 358 entering silicon substrate 376 between buried insulator layer (or BOX) 374 and a top surface of silicon substrate 376. In some implementations, photodiode 307A may be configured to detect light 358 entering silicon substrate 376 in a direction parallel to the top surface of silicon substrate 376. However, in other implementations, photodiode 307A may be configured to detect light 358 entering silicon substrate 376 in a direction approximately parallel to the top surface of silicon substrate 376.

Figure 3B:
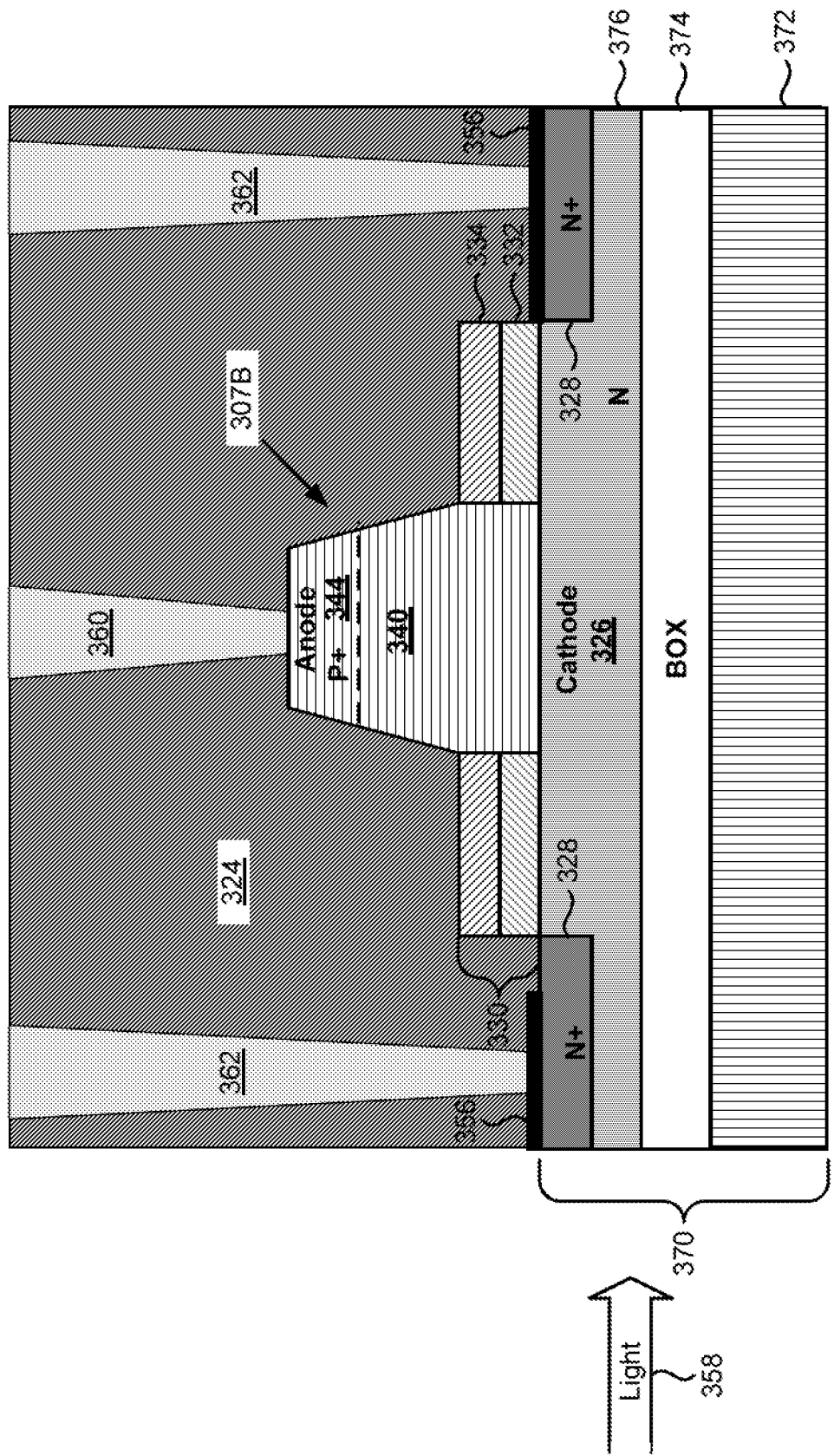
FIG. 3B shows a cross-sectional view of an exemplary anode over cathode germanium and silicon photodiode coupled to metal contacts enabling integration of the photodiode with other active and/or passive circuit elements, according to yet another implementation.

FIG. 3B shows a cross-sectional view of exemplary anode over cathode germanium and silicon photodiode 307B coupled to metal contacts enabling integration of photodiode 307B with other active and/or passive circuit elements, according to yet another implementation. It is noted that any features identified in FIG. 3B by reference numbers identical to those appearing in FIG. 3A correspond respectively to those features and may share any of their characteristics described above.

In addition to the features shown in FIG. 3A and described above, FIG. 3B shows interlayer dielectric 324 formed over photodiode 307B, metal contact 360 extending through interlayer dielectric 324 to connect to P type germanium region 344 serving as the anode of photodiode 307B, and metal contacts 362 extending through interlayer dielectric 324 to connect to cathode contacts 356.

Metal contacts 360 and 362 may be formed of Tungsten (W) for example, and may connect P type germanium region 344 and cathode contacts 356 to one or more metallization layers of an integrated circuit chip or die including photodiode 307B. Interlayer dielectric 324 may be formed using any material and any technique typically employed in the art. For example, interlayer dielectric 324 may be formed of $SiO_2$, which may be deposited or thermally grown. As another example, interlayer dielectric 324 may include one or more $Si_3N_4$, layers, which may also be deposited or thermally grown. As yet another example, interlayer dielectric 324 may be formed of a dielectric material having a lower dielectric constant than $SiO_2$, such SiOC, for example. Photodiode 307B differs from photodiode 307A, in FIG. 3A, in that optional blanket silicon layer 350 is not formed over germanium structure 340 and hard mask 330 prior to P type dopant implantation into germanium structure 340, resulting in the omission of P type silicon cap 352 over P type germanium region 344, as well as omission of silicided anode contact 354 situated on. P type silicon cap 352. Consequently, metal contact 360 situated on P type germanium region 344, which may be formed as a tungsten metal contact, for example, serves as the anode contact of photodiode 307B. Thus, although like photodiode 307A, photodiode 307B may include silicided cathode contacts 356, the anode contact provided by metal contact 360 may not be a silicided contact.

Anode over cathode germanium and silicon photodiodes 307A and 307B disclosed above advantageously achieve significantly reduced contact resistance when compared to conventional photodiodes, such as one order of magnitude or approximately ten times reduction in contact resistance when compared to conventional cathode over anode photodiode structures. Moreover, anode over cathode germanium and silicon photodiodes 307A and 307B have reduced contact resistance while concurrently having superior responsivity, radiant sensitivity, high bandwidth, and low dark current density. By way of example, anode over cathode germanium and silicon photodiodes 307A and 307B may advantageously provide a low interconnect sheet resistance of approximately ten ohms per square ($\sim 10^{Ohm_1}{}_{sq}$), a responsivity of almost one ampere per watt ($\sim 0.9^{A_1}{}_w$), a 3 dB bandwidth of approximately seventy gigahertz ($\sim 70$ Hz), and a dark current density of approximately ninety milliamperes per square centimeter at one volt ($\sim 90 {}^{mA_1}{}_{cm^1}$ at $1V$).

Thus, the present application discloses an anode over cathode germanium and silicon photodiodes and methods for their fabrication. Such a photodiode includes a P type germanium anode formed over an N type silicon cathode. Silicided cathode contacts formed on the N type cathode advantageously reduce N type contact resistance. In some implementations, the photodiode includes a silicon cap formed over and protecting the germanium structure providing the anode of the photodiode during fabrication and processing. In addition, when present, the silicon cap advantageously enables formation of a silicided anode contact over the P type anode, thereby further advantageously reducing P type contact resistance.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A photodiode comprising:
   an N type silicon region formed in a silicon substrate, said N type silicon region being a cathode of said photodiode;
   a P type germanium region situated over said N type silicon region, said P type germanium region being an anode of said photodiode;
   a dielectric layer situated over said N type silicon region, said dielectric layer having an anode window, said P type germanium region situated within said anode window;
   an anode contact of said photodiode situated on said P type germanium region.

2. The photodiode of claim 1, wherein said silicon substrate is a bulk silicon substrate in a bulk silicon device.

3. The photodiode of claim 1, wherein said silicon substrate is a top silicon layer in a silicon-on-insulator (SOI) device.

4. The photodiode of claim 1, wherein a cathode contact of said photodiode situated on said N type silicon region is a silicided contact.

5. The photodiode of claim 1, wherein said anode contact comprises tungsten (W).

6. The photodiode of claim 1, wherein said dielectric layer is a multi-layer comprising an upper dielectric layer over a lower dielectric layer.

7. A photodiode comprising:
   an N type silicon region formed in a silicon substrate, said N type silicon region being a cathode of said photodiode;
   a P type germanium region situated over said N type silicon region, said P type germanium region being an anode of said photodiode;
   a dielectric layer situated over said N type silicon region, said dielectric layer having an anode window, said P type germanium region situated within said anode window;
   a P type silicon cap over said P type germanium region;
   an anode contact of said photodiode being situated on said P type silicon cap.

8. The photodiode of claim 7, wherein said silicon substrate is a bulk silicon substrate in a bulk silicon device.

9. The photodiode of claim 7, wherein said silicon substrate is a top silicon layer in a silicon-on-insulator (SOI) device.

10. The photodiode of claim 7, wherein said anode contact situated on said P type silicon cap is a silicided contact.

11. The photodiode of claim 7, wherein a cathode contact of said photodiode situated on said N type silicon region is a silicided contact.

12. The photodiode of claim 7, wherein said dielectric layer is a multi-layer comprising an upper dielectric layer over a lower dielectric layer.

13. A photodiode comprising:
    an N type silicon region formed in a top silicon layer in a silicon-on-insulator (SOI) device, said N type silicon region being a cathode of said photodiode;
    a P type germanium region situated over said N type silicon region, said P type germanium region being an anode of said photodiode;
    a dielectric layer situated over said N type silicon region, said dielectric layer having an anode window, said P type germanium region situated within said anode window;
    a P type silicon cap over said P type germanium region;
    an anode contact of said photodiode being situated on said P type silicon cap;
    wherein said anode contact situated on said P type silicon cap is a silicided contact.

14. The photodiode of claim 13, wherein a cathode contact of said photodiode situated on said N type silicon region is a silicided contact.

15. The photodiode of claim 13, wherein said anode contact comprises tungsten (W).

16. The photodiode of claim 13, wherein said dielectric layer is a multi-layer comprising an upper dielectric layer over a lower dielectric layer.

17. A photodiode comprising:
    an N type silicon region formed in a bulk silicon substrate in a bulk silicon device, said N type silicon region being a cathode of said photodiode;
    a P type germanium region situated over said N type silicon region, said P type germanium region being an anode of said photodiode;
    a dielectric layer situated over said N type silicon region, said dielectric layer having an anode window, said P type germanium region situated within said anode window;
    a P type silicon cap over said P type germanium region;
    wherein a cathode contact of said photodiode situated on said N type silicon region is a silicided contact.

18. The photodiode of claim 17, wherein an anode contact of said photodiode is situated on said P type silicon cap.

19. The photodiode of claim 18, wherein said anode contact situated on said P type silicon cap is a silicided contact.

20. The photodiode of claim 17, wherein said dielectric layer is a multi-layer comprising an upper dielectric layer over a lower dielectric layer.

* * * * *